United States Patent [19]

Bhatia et al.

[11] Patent Number: 4,746,815

[45] Date of Patent: May 24, 1988

[54] ELECTRONIC EC FOR MINIMIZING EC PADS

[75] Inventors: Harsaran S. Bhatia, Hopewell Junction; Mario E. Ecker, Poughkeepsie, both of N.Y.; Harry J. Jones, Austin, Tex.; Shashi D. Malaviya, Hopewell Junction, N.Y.

[73] Assignee: International Business Machines Corporation, Armonk, N.Y.

[21] Appl. No.: 881,755

[22] Filed: Jul. 3, 1986

[51] Int. Cl.[4] .................. H03K 3/26; H03K 3/335
[52] U.S. Cl. .................... 307/303; 307/42; 307/242; 371/15; 361/395
[58] Field of Search ......... 307/303, 219, 42, 241–243; 361/393, 395, 420; 371/15; 324/73 R

[56] References Cited

U.S. PATENT DOCUMENTS

| | | | |
|---|---|---|---|
| 3,170,071 | 2/1965 | Griesmer et al. | 307/219 |
| 3,815,025 | 6/1974 | Jordan | 324/73 R |
| 4,357,703 | 11/1982 | Van Brunt | 371/15 |
| 4,417,203 | 11/1983 | Pfeiffer et al. | 324/51 |
| 4,445,048 | 4/1984 | Grahan | 307/42 |
| 4,485,472 | 11/1984 | Sproull | 371/15 |
| 4,489,364 | 12/1984 | Chance et al. | 361/395 |
| 4,526,859 | 7/1985 | Christensen et al. | 430/314 |
| 4,549,200 | 10/1985 | Ecker et al. | 357/80 |
| 4,659,942 | 4/1987 | Volp | 307/42 |

Primary Examiner—Stanley D. Miller
Assistant Examiner—Richard Roseen
Attorney, Agent, or Firm—William T. Ellis

[57] ABSTRACT

A specially designed module and integrated circuit chip therefor which permits the sharing of module EC pads between chip receiver and driver circuits. The chip has a direct normal input line to each receiver circuit therein and a direct normal output line from each driver circuit therein along with signal lines from each of those circuits to various EC pads. The chip further includes a switching and control circuit for switching the receiver circuits and driver circuits between their normal and EC lines to effect an electronic delete function. In a preferred embodiment, a majority of the EC pads are switchably connected via the switching and control circuit to different sets of three adjacent receiver circuits, driver circuits, or a combination thereof. The design permits the use of approximately half the EC pads normally required for a module, while permitting EC connections to be made in most cases to three adjacent receiver or driver circuits simultaneously.

32 Claims, 1 Drawing Sheet

ELECTRONIC EC FOR MINIMIZING EC PADS

BACKGROUND OF THE INVENTION

The present invention relates generally to very large scale integrated circuit devices, and more particularly to a VLSI design for significantly reducing the number of engineering change (EC) pads utilized in such devices.

The trend in very large scale integration devices is to increase the number of circuits per semiconductor chip. This increased number of crrcuits requires an increasing number of input and output terminals (I/O's) per chip in order to permit maximum utilization of these circuits in accordance with Rent's rule.

The electronics industry currently utilizes multilayered circuit packaging modules (typically ceramic) for carrying these large scale integrated circuit chips. These VLSI chips are mounted on the top surface of the module at selected chip sites. Each chip site is composed of a central array of chip connection vias (lead/tin solder balls or microsockets). These chip connection vias at the chip site are routed down through the various layers of the ceramic module and then are routed to various other chips on the module surface in order to communicate therewith. The signal redistribution lines between chip vias are generally formed by first punching holes in individual, flexible, unfired green sheets of soft ceramic layers and then printing or screening a patterning paste through a metal mask to form predetermined wiring patterns on the green sheet and to fill the various holes punched therein. The completed module is fabricated by stacking multiple green sheet layers together to form a semi-hard stack or laminate, which is then fired. The resulting structure is a high performance module for VLSI chips typically containing 60-70 wiring layers. However, defects such as opens in the via connections between green sheet layers, opens in the horizontal lines screened in the green sheets, and shorts between lines can occur during the green sheet stacking process used in forming the module. Accordingly, it is highly desirable to be able to correct such manufacturing defects in the module. Likewise, it is highly desirable to be able to make engineering changes to correct for design errors in the interconnections between the I/O's of various chips on the module.

In order to facilitate such defect corrections and engineering changes, engineering change (EC) pads are provided for each signal I/O terminal of the chip. The purpose of these EC pads is to allow the correction of these wiring defects by the deletion of the internal wiring and its replacement with discrete surface wires. A standard design for such EC pads is a deposit of metal in the shape of a dumbbell. The EC pad is located between the I/O terminal of the chip and a via which connects to internal wiring in the ceramic module. When it is desired to break the connection between this particular I/O terminal of the chip and the via connected to the internal wiring of the module, then the narrow portion between the dumbbells may be broken by means such as laser evaporation. This I/O terminal may then be connected to the I/O terminal of another chip by means of, for example, the ultrasonic bonding of a surface wire therebetween.

Currently, state-of-the-art multi-layer chip carrying modules utilize a separate EC pad for each chip I/O pad. These EC pads are generally disposed in concentric rings around the perimeter of each chip. Accordingly, as the number of circuits and their attendant I/O pads increase, the number of EC pads required around the perimeter of the chip increases correspondingly. The net result is that approximately half of the mounting surface on the module is allocated to EC pads and related spacings.

Attempts have been made to reduce the size of a typical 100 micron x 100 micron EC pad. However, the EC pad size is constrained by certain minimum area requirements imposed by the need to physically perform weld and delete operations at the pad.

The above-described EC requirements result in a significant loss of chip packing density. This loss in chip packing density causes a loss of module circuit capacity and thus higher circuit packaging costs, as well as delay.

The invention as claimed is intended to remedy the above-described drawbacks. It solves the problem of the increasing space required on the multilayer module for engineering change operations while at the same time, increasing the communication speed between chips.

SUMMARY OF THE INVENTION

Briefly, the invention comprises an integrated circuit device containing a minimum number of EC pads but permitting in most cases the EC of at least three adjacent receivers or drivers in a chip, comprising:

a module for carrying on a surface thereof at least one integrated circuit chip;

a plurality of EC pads disposed on the surface of this module;

an integrated circuit chip including a plurality of receiver circuits and driver circuits, each circuit having a normal I/O signal line going to a point external to the chip and at least one EC signal line conected thereto, and a switching and control circuit for switchably connecting each of a plurality of the EC pads to a different set of at least three different receiver circuits, driver circuits, or a combination thereof.

In a preferred embodiment, the switching and control circuit of the chip comprises means for switchably connecting the majority of the EC pads to only three adjacent receiver circuits, driver circuits, or a combination thereof. In this preferred embodiment, the middle receiver or driver circuit of the three adjacent circuits is only switchabiy connected to a single EC line, and the two end circuits are switchably connected to two EC lines each, with each of those EC lines being connected to a different EC pad.

The switching and control circuit typically includes an electronic switch in the chip for each of the normal and the EC lines tor controlling the signals propagating therein. A shift register may then be formed in the chip tor controlling these electronic switches. This shift register may include a separate stage for each of the electronic switches, with the output of each of the stages being connected to control the operation of its respective switch. An external signal control pad disposed on the module may be utilized to provide a desired sequence of logic signals to the shift register stages to control the switches.

BRIEF DESCRIPTION OF THE DRAWINGS

One way of carrying out the invention is described in detail below with reference to the drawings which illustrate one specific embodiment, in which.

DETAILED DESCRIPTION OF THE PREFERRED EMBODIMENT

The present invention is based on the simultaneous use of three important features in a single combination. These features are the sharing of EC pads between the various receivers and drivers in the chip; in combination with a normal direct input line from a point external of the chip into each chip I/O receiver and a normal output line going off the chip from each chip I/O driver; in combination with an electronic delete function for controlling whether a given signal propagates through the normal line into the I/O terminal or is diverted to the EC line connected to one of the shared EC pads.

Figure 1:
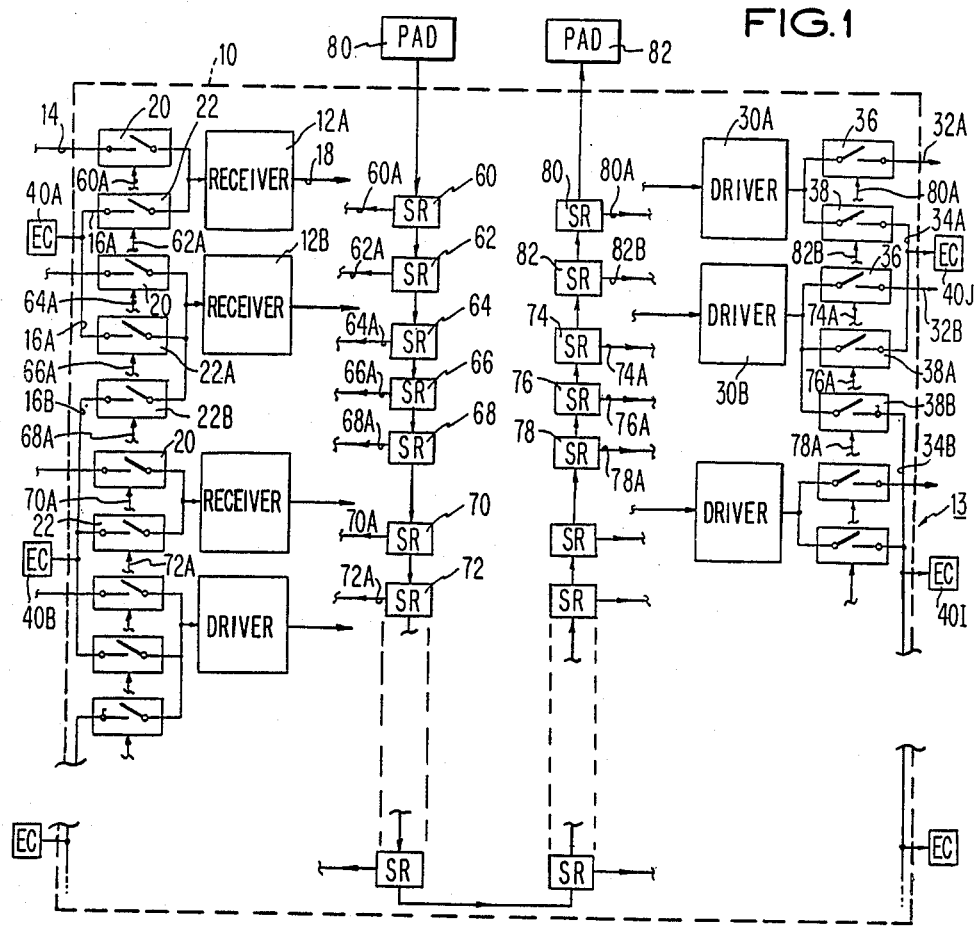
FIG. 1 is a schematic block diagram of one embodiment of the present invention.

Referring now to FIG. 1, a chip 10 designed in accordance with the present invention is set forth. Chip 10 is disposed on a surface 13 of a module designed for carrying integrated circuit chips. The chip 10 may comprise a set of n standard receiver circuits 12 therein for receiving signals from sources external to the chip 10. Such receiver circuits 12 are typically formed by using standard logic gates. Each of these n receiver circuits 12 has a normal input line 14 connected thereto which originates from a point external to the chip. Each of these receiver circuits 12 also includes at least one EC input line 16 connected at the input of the receiver circuit. Finally, each receiver circuit 12 has an output line 18 connected to further circuits in the chip 10.

A plurality of electronically controlled switches are utilized for controlling the propagation of the signals in the normal line 14 and EC line 16. More specifically, an electronically controlled switch 20 is disposed to control the propagation of the signal on line 14. Likewise, an electronically controlled switch 22 is disposed for controlling the propagation of a signal on the EC line 16. These electronically controlled switches 20 and 22 for each of the receivers 12 are represented by knife switches for ease of representation. However, it is to be understood that these switches are to be implemented by electronic components.

In FIG. 1, the switches 20 and 22 for the receivers 12 have been shown external to the actual receiver circuit blocks shown in the Figure. However, it should be understood that the electronic components for implementing these electronic switches may easily be incorporated into the electronic circuitry of the receiver circuits themselves. There is no intent to limit the location of these electronic switches to be either external to or internal to the receiver circuits 12.

The integrated circuit chip 10 also includes m driver circuits 30 for providing output signals to points external to the chip 10. Again, these driver circuits 30 may be implemented simply by standard logic gates. Each of these m driver circuits 30 has a normal output line 32 connected thereto which originates from a point external to the chip 10, and at least one EC output line 34 connected thereto. An electronic switch 36 is provided to control the signals on line 32, while an electronic switch 38 is provided to control the signals on line 34.

Disposed on the surface 13 of the module external to the chip 10 are a set of p EC pads 40. These EC pads are for the purpose of permitting engineering changes to be made on the interconnections between various I/O's for the chips on the module 13. Typically, such interconnections will be made by means of the ultrasonic welding of a wire from a selected EC pad 40 adjacent to the chip 10 to another selected EC pad adjacent to a different chip. These EC pads 40 are formed by depositing suitable metals in the form of a pad with dimensions on the order of 100×100 microns or less. Note that these EC pads 40 do not have the standard dumbbell shape because a laser delete neck is not required with this invention. Accordingly, each of these EC pads 40 may be significantly smaller in area than standard dumbbell shaped EC pads.

Each of these EC pads 40 is shared by at least two receiver or driver circuits. In a preferred embodiment, each EC pad 40 is shared by three adjacent receiver or driver circuits, or a combination thereof. The actual connections to the EC pads 40 is by way of the EC lines 16 for the receiver circuits 12 and by way of the EC lines 34 for the driver circuits 30. In FIG. 1, each of the EC pads 40 is connected to three adjacent receiver circuits or driver circuits, except for the first EC pad 40A and the last EC pad 40J. It should be noted that with a different arrangement of circuit elements in the chip, it is possible to connect or share every EC pad 40 with at least three receiver or driver circuits.

It has been discovered that the three-way sharing arrangement of p-2 EC pads shown in FIG. 1 is most preferred in that it solves a significant contention problem which occurs in EC pad sharing when adjacent receiver or driver circuits must have engineering change interconnections made thereto. It can be seen in FIG. 1 that in a majority of the cases three adjacent receivers or drivers can have engineering changes performed thereon simultaneously. It has been found that there is an extremely low probability tnat any more than three adjacent receiver circuits or driver circuits would require engineering changes simultaneously. Accordingly, the circuit of FIG. 1 is extremely advantageous in that it significantly reduces the number of EC pads 40 required while permitting a sufficient number of EC pads to allow the simultaneous engineering change of three adjacent receiver circuits or driver circuits.

As noted previously, each of the lines 20 and 22 into the receiver circuits 12 and each of the lines 32 and 34 from the driver circuit 30 include an electronically controllable switch therein. In a normal mode with no engineering changes implemented, the switch 20 for the normal input lines for each of the receiver circuits 12 is closed to thereby permit an external input signal to be applied directly to the receiver circuits 12. Note that this normal input line 14 does not include an EC pad therein and thus avoids the delay attendant to the use of such an EC pad. When it is desired to make an engineering change on the input of the receiver circuit 12, then a control signal can be applied to the switch 20 to open that switch and to close the switch 22 for the EC line 16 into the particular receiver circuit 12. This electronic control of the switches 20 and 22 provides an electronic delete for the normal input line 14 and the substitution therefor of the EC line 16.

In order to control these plurality of switches 20, 22, 32, and 34, some form of electronic control circuit must be provided in the chip 10. There are a variety of different circuit configurations which may be utilized in order to implement such a control circuit to control these various switches. In the embodiment shown in FIG. 1, the control circuit is implemented by means of a shift register 55 which comprises a separate shift register stage for each of the plurality of switches 20, 22, 32, and 34. Each of these shift register stages is connected in a series loop, with the first shift register stage 60 connected to a signal control pad 80 which is external to the chip. In the Figure, the first shift register stage 60 provides a control signal on line 60A for controlling the switch 20. A second shift register stage 62 provides a control signal on line 62A for controlling the switch 22. A third shift register stage 64 provides a control signal on line 64A to control the switch 20 for the next receiver circuit 12B. This second receiver circuit 12B has an EC line 16A which connects the receiver circuit 12B to the EC pad 40A, and an EC line 16B which connects the receiver circuit 12B to the next adjacent EC pad 40B. A shift register stage 66 provides a control signal on line 66A to control the switch 22A in the EC line 16A to receiver 12B. Likewise, a shift register stage 68 provides a control signal on line 68A for controlling the switch 22B in the EC line 16B to receiver 12B. This pattern of a shift register stage for controlling each individual switch can be seen to continue for each of the receiver circuits 12 in the array. Likewise, an individual shift register stage is provided for controlling each of the switches in the driver output lines 32 and 34. For purposes of illustration, the shift register stage 74 provides a control signal on line 74A to control the switch 36 in the normal output line 32 for the second driver circuit 30b in the figure. Likewise, a separate shift register stage 76 provides a control signal on line 76A for controlling the switch 38A in the line 34A to the EC pad 40J. The shift register stage 78 provides a control signal on line 78A to control the switch 38B in the line 34B going to the EC pad 40I set directly below the EC pad 40J. This control pattern for the switches in the output lines for the driver circuits 30 continues for the entire array of driver circuits.

By applying a proper sequence of zeros and ones from the external control pad 80 through the stages of the shift register 55, each of the switches 20, 22, 32, and 34 may be properly controlled to be in its active or inactive state. The proper pattern of zeros and ones to be applied to the shift register 55 is determined by the needed engineering changes required for the chip and the underlying module connections. With this technique, one single external control pad may be utilized to control a large number of receiver and driver circuit switches.

It should be noted that the shift register stages shown in FIG. 1 do not need to be very fast because once the switches are set in their desired sequence, they are not switched again. Accordingly, these shift register stages can be fabricated with very elementary, low power flip-flops and data transfer gates. A shift register of this type needs relatively few components and its power consumption is low. This shift register may be of the biased type so that its outputs are always in a predetermined logical pattern when the power is turned on.

The output from the last shift register does not need to be applied to any particular destination. However, an output control pad 82 has been provided in FIG. 1 in order to provide the ability to clock the entire pattern of zeros and ones therethrough to verify that the entire pattern of ones and zeros is being clocked through the shift register 55.

It should be noted that there are a variety of methods that could be utilized for looping the different shift register stages together. In the embodiment shown in FIG. 1, the shift register stages for adjacent receiver circuits 12 are consecutively linked together. Various other looping configurations could be substituted for this implemented configuration without changing the operation of the invention. By way of example, the shift register stages controlling a given receiver circuit could be looped directly to the shift register stages controlling the switches for an adjacent driver circuit 30, and this looping pattern could be continued for the entire array of receiver and driver circuits.

Figure 2:
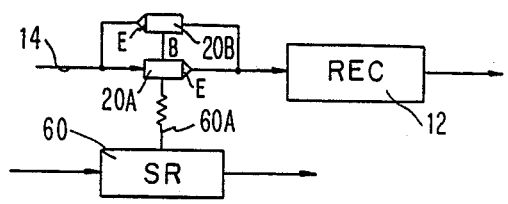
FIG. 2 is a schematic block diagram of an electronic switch-shift register stage which may be utilized to implement the embodiment shown in FIG. 1.

There are a variety of circuits which may be utilized to implement the electronic switches in the input and output lines to the receiver circuits and driver circuits. By way of example, FIG. 2 shows a simple transistor switch for implementing the switch 20 in FIG. 1. The transistor switch 20 shown in the figure may comprise a pair of bipolar transistors 20A and 20B with their base terminals tied together and to the shift register stage 60. In the configuration, the emitter of transistor 20A is connected to the collector of transistor 20B, while the collector of transistor 20A is connected to the emitter of transistor 20B. The collector of transistor 20A is connected to the normal input line 14, and its emitter is connected to the input of the first receiver 12A. The shift register stage 60 applies a "zero" or "one" voltage via the line 60A to the base of the transistor switch 20. When the logic signal on the line 60A is a logic "one", then the transistors 20A and 20B are biased into conduction and signals on the normal input line 14 may be applied directly to or from the receiver circuit 12. When the logic signal on line 60A is a logic "zero", then the transistors 20A and 20B are nonconductive, and signals on line 14 are not further propagated. It is to be understood that there are a variety of other circuit configurations which may be utilized to implement the switch 20.

It should also be noted that the present invention can be implemented, for example, by using receivers designed with two or more input lines. The first input line would be for the normal line, and the other input lines would be for EC pad connections. A control circuit built into the receiver could then be used to activate any one of these multiple input terminals, while keeping the other input lines inactive. An example of such a receiver design is disclosed in patent application FI9-86-020.

As noted above, the present invention is implemented by means of the sharing of EC pads, in combination with the use of an electronic delete function, and further in combination with the use of direct input and output lines for each of the receiver circuits and driver crrcuits. This inventive combination permits a significant reduction of approximately 50% of the EC pads on a given chip module. Likewise, the EC pads that are used on the module are reduced in size because a delete land is not required on the EC pad. With this significant EC pad reduction, the number of chips that can be supported on a multi-chip module without increasing the module surface size is significantly increased. By increasing the number of chips on a given module, it is now possible to perform more logic functions and computing on a single module, thereby resulting in fewer module-to-module crossings in the product. Fewer module-to-module crossings result in a reduction in package operation delays.

It should be noted that the EC pads are not initially in series with the chip I/O pathways to and from the receiver circuits and the driver circuits. This is in contrast to prior art designs which utilize an EC pad in series with the I/O input to each receiver circuit and an EC pad in series with the I/O output from each driver circuit. This removal of the EC pads from the normal I/O lines into the chip provides a further reduction in propagation delay between chips.

The present sharing design for EC pads has a very low probability of engineering change conflict. In particular, with this sharing design, three adjacent receiver circuits, driver circuits, or a combination thereof can simultaneously have engineering change connections made thereto, thereby eliminating the great majority of potential engineering change conflicts.

While the invention has been illustrated and described with respect to preferred embodiments of this invention, it is to be understood that the invention is not limited to the precise construction herein disclosed and the right is reserved to all changes and modifications coming within the scope of the invention, and defined in the appended claims.

What is claimed is:

1. An integrated circuit device containing a minimum number of EC pads but permitting EC of at least two adjacent receivers or drivers or a combination thereof in a chip, comprising:
   a module for carrying on a surface thereof at least one integrated circuit chip,
   a first plurality of EC pads disposed on said surface of said module; and
   an integrated circuit chip including a plurality of receiver circuits and driver circuits, each receiver circuit and driver circuit having a first signal line connected thereto, a second signal line going to a point external to the chip, and at least one EC signal line, said integrated circuit chip further including switching means for connecting only one of said second signal line and said at least one EC signal line to said first signal line, and means for connecting each of a second plurality of said EC pads to a different set of at least three EC signal lines from receiver circuits, driver circuits, or a combination thereof.

2. A device as defined in claim 1, wherein said switching and control circuit comprises means for connecting each of said plurality of EC pads to only three adjacent of said receiver circuits, driver circuits, or a combination thereof.

3. A device as defined in claim 2, wherein said three adjacent receiver circuits, driver circuits, or a combination thereof comprise a middle receiver or driver circuit and two end circuits disposed adjacent thereto, and wherein said middle receiver or driver circuit is connected to only one EC line.

4. A device as defined in claim 3, wherein each of said two end circuits have two EC lines connected thereto, with each EC line being connected to a different EC pad.

5. A device as defined in claim 2, wherein said switching and control circuit includes an electronic switch in said chip for each of said normal and EC lines for controlling the signals propogating therethrough.

6. A device as defined in claim 5, wherein said switching and control circuit includes a shift register formed in said chip for controlling said electronic switches.

7. A device as defined in claim 6, wherein said shift register includes a separate stage for each of said electronic switches, with each of said stages being connected to control the operation of its respective switch, and with said stages being connected in series, and further comprising an external signal control pad disposed on said module external to said chip for providing a desired sequence of logic signals to said shift register stages to control said switches 8. A device as defined in claim 1, wherein said switching and control circuit includes an electronic switch in said chip for each of said normal and EC lines for controlling the signals propagating therethrough.

9. A device as defined in claim 8, wherein said switching and control circuit includes a shift register formed in said chip for controlling said electronic switches.

10. A device as defined in claim 9, wherein said shift register includes a separate stage for each of said electronic switches, with each of said stages being connected to control the operation of its respective switch, and with said stages being connected in series, and
   further comprising an external signal control pad disposed on said module external to said chip for providing a desired sequence of logic signals to said shift register stages to control said switches.

11. An integrated circuit device containing a minimum number of EC pads comprising:
   a module for carrying on a top surface thereof at least one integrated circuit chip;
   an integrated circuit chip having
      n receiver circuits therein for receiving signals from external to said chip, with each of said n receiver circuits having a main input line connected thereto which line originates from a pornt external to said chip, and at least one EC input line connected thereto,
      m driver circuits therein for providing output signals to points external to said chip, with each of said m driver circuits having a main output line connected thereto which originates from a point external to said chip, and at least one EC output line connected thereto,
      a plurality of electronically-controllable switches with an electronic control signal input for each of said switches for insuring that, for each of said n receiver circuits, the signal from only one of said main input line or one of said at least one EC input lines is processed by that receiver circuit and for insuring that, for each of said m driver circuits, the signal therefrom is applied through only one of said driver main output lines or one of said at least one EC output lines,
      means for generating said plurality of electronic control signals for application to said control signal inputs in accordance with an external control signal for controlling said plurality of switches to insure that only one input signal is processed by each of said n receivers, and that the output signal from each of said m driver circuits is applied through only selected output lines; and
   p EC pads disposed on said surface of said module external to said chip, with at least p-2 of said EC pads each connected to at least three adjacent of said receiver circuits or driver crrcuits or a combination thereof via said EC lines, with p-2 being less than n+m.

12. A device as defined in claim 11, wherein each of said p-2 EC pads are connected to only three adjacent of said receiver circuits, driver circuits, or a combination thereof.

13. A device as defined in claim 12, wherein said the three adjacent receiver circuits, driver circuits, or a combination thereof comprise a middle receiver or driver circuit and two end circuits disposed adjacent thereto, and wherein said middle receiver or driver circuit is connected to only one EC line.

14. A device as defined in claim 13, wherein each of said two end circuits have two EC lines connected thereto, with each EC line being connected to a different EC pad.

15. A device as defined in claim 11, wherein said control signal generating means comprises a shift register formed in said chip.

16. A device as defined in claim 15, wherein said shift register includes a separate stage for each of said plurality of switches, and further comprising a signal control pad disposed on said module external to said chip for providing a desired sequence of logic signals to said shift register stages to control said plurality of switches.

17. A device as defined in claim 16, wherein each of said normal input and output lines and said EC input and output lines includes one of said plurality of switches therein for controlling the signal propagation therein.

18. A device as defined in claim 17, wherein said plurality of switches are external to said receiver and driver circuits.

19. A device as defined in claim 14, wherein said control signal generating means comprises a shift register formed in said chip.

20. A device as defined in claim 19, wherein said shift register includes a separate stage for each of said plurality of switches, and further comprising a signal control pad disposed on said module external to said chip for providing a desired sequence of logic signals to said shift register stages to control said plurality of switches.

21. An integrated circuit chip designed for permitting electronic engineering changes comprising:
a plurality of receiver circuits for receiving signals from external to said chip, with each of said receiver circuits having a main input line connected thereto which originates from a point external to said chip, and at least one EC input line connected thereto;
a plurality of driver circuits for providing output signals to points external to said chip, with each of said driver circuits having a main output line connected thereto which originates from a point external to said chip, and at least one EC output line connected thereto;
means for arranging each of a majority of said receiver and driver circuits EC lines into different sets of at least three EC lines from at least three different receiver circuits, driver circuits, or a combination thereof and connecting each of said sets to a different respective external EC line connected to a different respective point external to said chip,
switching means for controlling signal propagation to said receiver circuits and from said driver circuits and for insuring that, for each of said receiver circuits, the signal from only one of said main input line thereto or one of said at least one EC input lines connected thereto is processed by that receiver circuit, and to insure that for each of said driver circuits, the signal therefrom is propagated through only one of said driver main output line or one of said at least one EC output lines; and
means for controlling said switching means in accordance with an external control signal.

22. A chip as defined in claim 21, wherein said connecting means includes means for forming the majority of said different sets by connecting said EC external point to only three EC lines from three adjacent of said receiver circuits, driver circuits, or a combination thereof.

23. A chip as defined in claim 22, wherein said three receiver circuits, driver circuits, or a combination thereof comprise a middle receiver or driver circuit, and two end receiver or driver circuits disposed adjacent to said middle circuit, and wherein said middle receiver or driver circuit is connected to only one EC line.

24. A chip as defined in claim 23, wherein each of said two end circuits have only two EC lines connected thereto, with each EC line being connected to a different EC pad.

25. A chip as defined in claim 22, wherein said switching means includes an electronic switch for each of said normal and EC lines for controlling the signals propagating thereon.

26. A chip as defined in claim 25, wherein said controlling means comprises a shift register formed in said chip for controlling said switches.

27. A chip as defined in claim 26, wherein said shift register includes a separate stage for each of said electronic switches, with each stage being connected to control the operation of its respective switch and with said stages being connected in series, and further comprising an external control line for providing a desired sequence of logic signals to said shift register stages to thereby control said switches.

28. A chip as defined in claim 27, wherein said electronic switches are formed in said chip external to said receiver and driver circuits.

29. A chip as defined in claim 21, wherein said switching means includes an electronic switch for each of said normal and EC lines for controlling the signals thereon.

30. A chip as defined in claim 29, wherein said controlling means comprises a shift register formed in said chip for controlling said switches.

31. A chip as defined in claim 30, wherein said shift register includes a separate stage for each of said electronic switches, with each stage being connected to control the operation of its respective switch and with said stages being connected in series, and further comprising an external control line for providing a desired sequence of logic signals to said shift register stages to thereby control said switches.

32. A chip as defined in claim 27, wherein said electronic switches are formed in said receiver and said driver circuit.

* * * * *